(12) United States Patent
Souchkov

(10) Patent No.: US 9,479,042 B1
(45) Date of Patent: Oct. 25, 2016

(54) SHUT-OFF CIRCUITRY HAVING TEMPERATURE STABLE THRESHOLD CURRENT SENSING

(71) Applicant: Maxim Integrated Products, Inc., San Jose, CA (US)

(72) Inventor: Vitali Souchkov, Concord, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 105 days.

(21) Appl. No.: 14/483,294

(22) Filed: Sep. 11, 2014

Related U.S. Application Data

(60) Provisional application No. 61/985,833, filed on Apr. 29, 2014.

(51) Int. Cl.
| | | |
|---|---|---|
| G05F 1/00 | (2006.01) | |
| G05F 3/04 | (2006.01) | |
| G05F 3/08 | (2006.01) | |
| G05F 3/16 | (2006.01) | |
| G05F 3/20 | (2006.01) | |
| H02M 1/08 | (2006.01) | |
| H02M 1/00 | (2006.01) | |

(52) U.S. Cl.
CPC ....... *H02M 1/08* (2013.01); *H02M 2001/0003* (2013.01)

(58) Field of Classification Search
CPC .......... G05F 1/461; G05F 1/56; G05F 1/561; G05F 1/563; G05F 1/565; G05F 1/569; G05F 1/573; G05F 1/5735; G05F 1/575; G05F 3/26; G05F 3/262
USPC ....... 323/241, 243, 266, 274, 277, 279, 280, 323/283, 284, 312, 315, 316, 317
See application file for complete search history.

(56) References Cited

U.S. PATENT DOCUMENTS

| | | | | |
|---|---|---|---|---|
| 5,734,259 A | * | 3/1998 | Sisson | H02M 3/1563 323/282 |
| 5,959,443 A | * | 9/1999 | Littlefield | G05F 1/565 323/283 |
| 6,433,527 B1 | * | 8/2002 | Izadinia | H02M 3/1584 323/300 |
| 7,506,184 B2 | * | 3/2009 | Burton | G06F 1/28 307/45 |

(Continued)

OTHER PUBLICATIONS

Christian Enz and Eric Vittoz, "CMOS low power analog circuit design," Emerging Technologies, Chapter 1.2, 1996.
Eric Vittoz and Jean Fellarth, "CMOS Analog Integrated Circuits Based on Weak Inversion Operation," IEEE Journal of Solid-State Circuits, vol. SC-12, No. 3, Jun. 1977, pp. 224-231.

(Continued)

*Primary Examiner* — Adolf Berhane
*Assistant Examiner* — Gary Nash
(74) *Attorney, Agent, or Firm* — Advent, LLP

(57) ABSTRACT

A circuit is described that provides low power and temperature stability in a compact design. In one or more implementations of the present disclosure, the circuit includes a current sensing element configured for generating a voltage drop based upon a current generated by a current source through a load. The circuit also includes an asymmetric differential circuit for generating a differential output based upon the voltage drop. The circuit also includes an amplifier electrically coupled to the asymmetric differential circuit, the amplifier for generating a single-ended output based upon the differential output, and a flip-flop module that transitions between a first state and a second state based upon the single-ended output. The flip-flop module controls operation of a switch, and the switch controls current flow to the load.

18 Claims, 6 Drawing Sheets

(56) References Cited

U.S. PATENT DOCUMENTS

| | | | |
|---|---|---|---|
| 7,915,871 B2* | 3/2011 | Wang | H02M 3/156 323/222 |
| 2008/0180075 A1* | 7/2008 | Xie | H02M 3/156 323/282 |
| 2011/0227548 A1* | 9/2011 | Tsai | H02J 1/102 323/282 |

OTHER PUBLICATIONS

C. Kittel, "Free Electron Fermi Gas", Introduction to Solid State Physics, 8th Edition, Chapter 6, pp. 131-159.

E. H. Nicollian and J. R. Brews, "Summary of Important Equations", MOS (Metal Oxide Semiconductor) Physics and Technology, Wiley, New York, 2003, p. 67.

Maxim Technology Research and Development, S18 B/C/M/F/U Design Guide, Design Guide Revision 3.18.0, pp. 269-272.

* cited by examiner

SHUT-OFF CIRCUITRY HAVING TEMPERATURE STABLE THRESHOLD CURRENT SENSING

CROSS-REFERENCE TO RELATED APPLICATIONS

The present application claims the benefit under 35 U.S.C. §119(e) of U.S. Provisional Application Ser. No. 61/985,833, filed Apr. 29, 2014, and titled "SHUT-OFF CIRCUITRY HAVING TEMPERATURE STABLE THRESHOLD CURRENT SENSING," which is herein incorporated by reference in its entirety.

BACKGROUND

Power efficient near-infrared laser radiation sources, such as vertical-cavity surface-emitting lasers, are perspective devices to be employed in human interface light sensing equipment. The lasers have significantly lower current consumption compared to laser emitting diode devices per generated photon.

SUMMARY

A circuit is described that provides low power and temperature stability in a compact design. In one or more implementations of the present disclosure, the circuit includes a current sensing element configured for generating a voltage drop based upon a current generated by a current source through a load. The circuit also includes an asymmetric differential circuit for generating a differential output based upon the voltage drop. The circuit also includes an amplifier electrically coupled to the asymmetric differential circuit, the amplifier for generating a single-ended output based upon the differential output, and a flip-flop module that transitions between a first state and a second state based upon the single-ended output. The flip-flop module controls operation of a switch, and the switch controls current flow to the load.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

A circuit is described that provides low power and temperature stability in a compact design (e.g., a first-order temperature independent current sensor). In implementations, the circuit does not utilize external temperature stable circuitry. In one or more implementations of the present disclosure, the circuit includes a current sensing element configured for generating a voltage drop based upon a current generated by a current source that flows through a load. In an implementation, the current source, the current sensing element, and the load are connected in series. The circuit also includes an asymmetric differential circuit for generating a differential output based upon the voltage drop. For example, the current sensing element may comprise a poly-salicide resistor. The circuit also includes an amplifier electrically coupled to the asymmetric differential circuit, the amplifier for generating a single-ended output based upon the differential output, and a flip-flop module that transitions between a first state and a second state based upon the single-ended output. For example, the module may comprise a D flip-flop device. The flip-flop module controls operation of a switch, and the switch controls current flow to the load.

In implementations, the circuit does not utilize temperature stable references or biasing while providing temperature stability of shut off threshold for the load current at the level of band gap references.

Example Implementations

Figure 1:
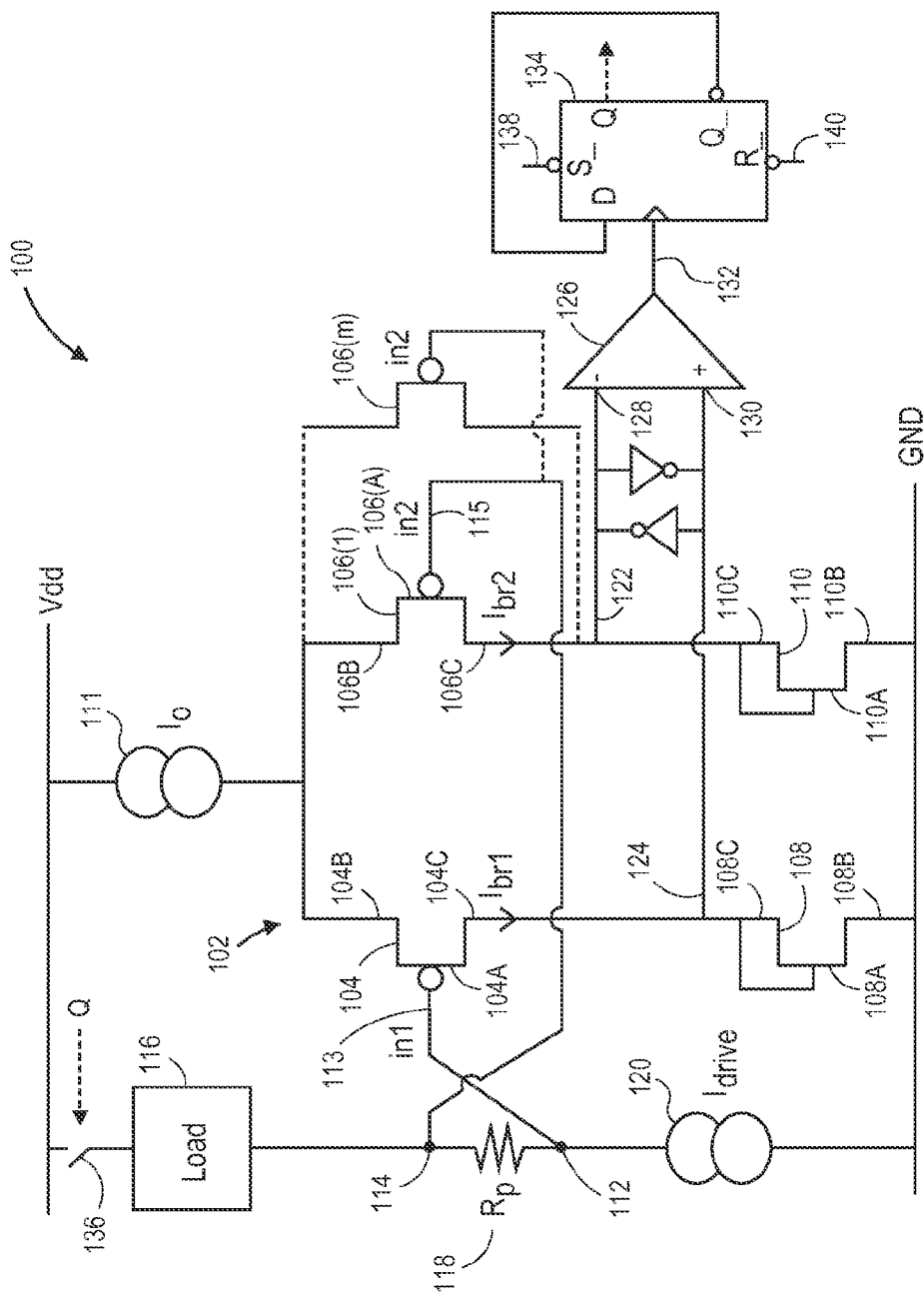
FIG. 1 is a circuit diagram of shut-off circuitry having temperature stable threshold current sensing capabilities in accordance with an example implementation of the present disclosure.

FIG. 1 illustrates a block diagram of an example shut off circuit 100 in accordance with an example implementation of the present disclosure. As shown, the shut off circuit 100 includes asymmetric differential circuit 102, which includes transistors 104, 106(1)-106(m), 108, 110. In an implementation, the transistors 104, 106(1)-106(m) comprise p-type metal-oxide-semiconductor (PMOS) transistors, and the transistors 108, 110 comprise n-type metal-oxide-semiconductor (NMOS) transistors. However, it is understood that the architecture of the circuitry 102 may modified such that the transistors 104, 106(1)-106(m) comprise NMOS transistors, and the transistors 108, 110 comprise PMOS transistors. As shown, the transistors 104, 106(1)-106(m) are connected to a current source 111 (e.g., current source $I_0$) that causes the transistors 104, 106(1)-106(m) to operate in weak inversion.

Each transistor 104, 106(1)-106(m), 108, 110 includes a respective gate (signified as "A"), a respective source (signified as "B"), and a respective drain (signified as "C"). The gates 108A, 110A of the transistors 108, 110 are connected to the respective drains 108C, 110C of the transistors 108, 110 (see FIG. 1). The transistors 108, 110 bulk can be connected to Vdd for PMOS transistors, and the transistors 108, 110 bulk can be connected to ground for NMOS transistors. As shown in FIG. 1, the gates 104A, 106A are connected to a node 112 and a node 114, respectively. These nodes 112, 114 provide interconnectivity functionality to the various circuit elements of circuitry 100. In an implementation, these nodes 112, 114 serve as inputs 113 (in1), 115 (in2) to the circuitry 102. For example, the node 114 comprises an electrical interconnection between a load 116, the gate 106A, and a current sensing element 118, and the node 112 comprises an electrical interconnection between the current sensing element 118, the gate 104A, and a current source 120. The current source 120 is connected in series with the load 116 and the current sensing element 118 and generates current that flows through the load 116 and the current sensing element 118 (when the switch 136 is in the closed configuration). In one or more implementations, as described in greater detail below, the load 116 comprises a forward biased vertical-cavity surface-emitting laser device.

The circuitry 102 also includes two output ports 122, 124 electrically connected to an amplifier 126, such as an operational amplifier. For example, the port 122 serves as an input to the inverting terminal 128 of the amplifier 126, and the port 124 serves as an input to the non-inverting terminal 130 of the amplifier 126. The amplifier 126 also includes an output port 132 that is electrically connected to a flip-flop module 134. The flip-flop module 134 is configured to control an operation of a switch 136 based upon the output of the amplifier 126. The switch 136 may be configured in a variety of ways. For example, the switch 136 may have an open configuration (e.g., open circuit to prevent current flow) and a closed configuration (e.g., closed circuit to allow current flow).

Drive current flowing through the load 116 is sensed by the current sensing element 118 when switch 136 is in the closed configuration. In an implementation, the current sensing element 118 comprises a resistor, or the like. For example, the current sensing element 118 may comprise a poly-salicide resistor. The voltage drop at the current sensing element 118 serves as the input to the differential pair of transistors 104, 106(1)-106(m). As discussed above, the circuitry 102 includes m transistors 106 that are connected to the input 115. For example, an m number of transistors 106 are electrically connected to the input 115 (e.g., node 112). The m number of transistors 106 may each be equivalent in size to the size of the transistor 104. The drains 104C, 106C of the transistors 104, 106(1)-106(m) are loaded at the transistors 108, 110, which are in a diode connection configuration (e.g., transistors with respective drains of these connected to corresponding gates). In an implementation, the transistors 108, 110 are equal sized transistors. The amplifier 126 is configured to convert the differential signal input voltage of the circuitry 102 to a single ended output. The amplifier 126 output drives the flip-flop module 134 (e.g., a D flip-flop circuit), and the output of the flip-flop module 134 controls the state of switch 136. The voltage difference generated at transistors 108, 110 in diode connection can trigger the change of the state for the flip-flop module 134 that may be externally set or reset by logic control signals connected to 'S_' and 'R_' terminals 138, 140. The circuitry 100 may be adjusted for other applications by connecting the current sensing element 118 above the load 116 shown in FIG. 1 or changing positions of the drive current source and load 116 for an implementation. In an implementation, level shifter circuitry may be used to connected to the current sensing element 118 terminals to inputs 113, 115 of the circuit without departing from the spirit of the disclosure. In another implementation, NMOS differential input devices may be utilized instead PMOS differential input devices without departing from the spirit of the disclosure.

It is contemplated that the operational power of the circuitry 100 may be maintained at minimum such that the bias current supplied by a current source 111 maintains the transistors 104, 106-106(m) in weak inversion. For example, the current may be below 0.5 uA in an implementation. In weak inversion, the expressions for the saturation currents flowing in branches of the asymmetric differential circuitry 102 may be modeled by:

$$I_{br1} = 2n_1\beta_1\varphi_T^2 \exp\left[\frac{V_{G1} - n_1 V_{S1} - V_{t0}}{n_1\varphi_T}\right] \quad (1)$$

$$I_{br2} = 2n_2\beta_2\varphi_T^2 \exp\left[\frac{V_{G2} - n_2 V_{S2} - V_{t0}}{n_2\varphi_T}\right] \quad (2)$$

$$\beta_1 = \mu C_{ox}\frac{W}{L}, \beta_2 = \mu C_{ox}m\frac{W}{L} \quad (3)$$

where VG, VS, Vt0, n are the standard designations of gate, source, threshold voltage, sub-threshold slope coefficient in MOS transistors, $\phi_T$—thermal potential; the numeric indexes correspond to the devices in FIG. 1, while β1 and β2 have standard expressions via carrier mobility—μ, unit area gate oxide capacitance—Cox, width and length of gates for MOS devices—W and L and their number—m. The drain-source voltages of the differential pair transistors may exceed many times the thermal potential $\phi_T=k_BT/q_0$ (where $k_B$—Boltzmann's constant, $q_0$—electron charge) so their contribution to the branch currents in expressions (1) and (2) may be neglected. The sources 104B, 106B of the transistors 104, 106(1)-106(m) may be maintained at the same potential VS1=VS2=VS because of differential operation. Thus, the sub-threshold coefficients may be equal for both transistors 104, 106(1)-106(m) of the differential pair, which is modeled by $$n(V_{G1})=n(V_{G2})=n_1=n_2=n \quad (4).$$

With at least substantially small current flowing through the current sensing element 118, the gates 104A, 106A of transistors 104, 106(1)-106(m) are at near equal potential and current Ibr2 is substantially higher than Ibr1 current resulting in the output port 132 of the circuit 100 pulled to GND potential. A larger drive current changes potential difference of the gates 104A, 106A for the transistors 104, 106(1)-106(m) according to expression:

$$I_{drive}R_p = V_{G1} - V_{G2} \quad (5)$$

With substantial voltage drop generated at current sensing element 118, the balance of currents Ibr1 and Ibr2 transitions (e.g., changes). For instance, equal loads of the asymmetric differential pair circuit 102 for Ibr1 and Ibr2 currents stipulates that the flip-flop module 134 driven by the signal at output port 132 occurs at conditions of equal currents in the branches of the differential pair (e.g., flip-flop transition occurs when currents become equal):

$$I_{br1} = I_{br2} \quad (6)$$

Using condition of expression (6) together with expressions (1) and (2) for the currents Ibr1 and Ibr2, the following condition for the flip-flop module 134 transition is generated by asymmetric differential pair 102 of the circuit 100 of FIG. 1 is obtained by:

$$\exp\left[\frac{V_{G1} - V_{G2}}{n\varphi_T}\right] = m \quad (7)$$

The threshold current (e.g., the drive current 'Idrive' value at which the flip-flop transition is generated) is expressed as follows:

$$I_{th} = \frac{n\varphi_T \ln[m]}{R_p} \quad (8)$$

To achieve the current sensitivity, and taking into account already substantial voltage drop at the load 116, (VCSEL voltage drop is about 2.3V in nominal operation) the circuit 100 may utilize a suitable resistor for the current sensing element 118. For example, a resistor having the characteristics of salicide poly-resistor having 8 Ohm/square resistance and maximal current density 5.56 mA/um may be selected. For the above resistor type, the temperature coefficient of the resistance is typical for metals. In first order approximation, the thermal dependence of resistance is given by expression (2):

$$R_p(T) = R_p(T_0)[1 + t_{c1}(T - T_0)] \quad (9)$$

where temperature coefficient for the electric resistance $t_{C1} = 3.27 \times 10^{-3}/°$ C. is similar to the one for technological metals in MOS technology. The nominal temperature used in the technology datasheet $T_0 = 33°$ C., therefore using numeric values in expression (9) an approximation is obtained:

$$R_p(T) = R_p(T_0)[1 - T_0 t_{c1}] + R_p(T_0)t_{c1}T \cong R_p(T_0)t_{c1}T \quad (10)$$

In some instances, the electric resistance of metals and alloys is a linear function of absolute temperature with small varying function at low temperatures (lower than Debye temperature) and linear term for the absolute temperature dependence that determines electric resistivity at hundred degrees range around nominal temperature is three orders of magnitude larger than the 'offset' constant term (at absolute zero temperature). Substituting the right part of expression (10) in expression (8) and using formula for thermal potential $\varphi_T$, the following expression for the threshold current at which the flip-flop module 134 transitions states may be expressed by:

$$I_{th} = \frac{n(T)k_B T \ln[m]}{q_0 R_p(T_0)[1 + t_{C1}(T - T_0)]} \cong \frac{n(T)k_B \ln[m]}{q_0 R_p(T_0)t_{C1}} \quad (11)$$

Thus, the temperature dependence of the threshold current is substantially determined by the temperature dependence of the sub-threshold slope n(T) at temperatures close to nominal. Neglecting contribution of silicon to gate dielectric interface trap capacitance (contribution is small in good MOS technologies), the sub-threshold slope coefficient is expressed as follows:

$$n = 1 + \frac{C_d}{C_{ox}} \quad (12)$$

where Cd—silicon depletion capacitance and Cox—gate oxide capacitance (both per unit area). The sub-threshold coefficient for the differential pair of transistors 104, 106 (1)-106(m) of the circuit 100 of FIG. 1 can be derived as follows:

$$n = 1 + \frac{t_{ox}}{\varepsilon_0 \varepsilon_{ox}} \left( \frac{q_0 N_B \varepsilon_0 \varepsilon_s}{2(2\varphi_T \ln[N_B/n_i] - 5\varphi_T + V_W - V_S)} \right)^{1/2} \quad (13)$$

where $N_B$—well (transistor body) doping concentration (n-well in the circuit of FIG. 1), ni—intrinsic carrier concentration in silicon, tox=14 nm—gate dielectric thickness for the transistors used in the circuit, $\Sigma_0$—vacuum dielectric permittivity $\Sigma_{ox}$=3.9 gate oxide permittivity (SiO2), $\Sigma_S$=11.9—dielectric permittivity of silicon. The well potential of the transistors 104, 106(1)-106(m) may be maintained at the power supply voltage (e.g., $V_W$=Vdd, $V_S$ is the source potential of the differential pair transistors). While respective doping centers are ionized in the region of the circuit operation, the temperature dependence of sub-threshold coefficient n(T) is determined by thermal potential $\phi_T$ and temperature dependence of intrinsic carriers concentration ni(T) which may be expressed as follows:

$$n_i(T) = 3.02 * 10^{15} T^{3/2} \mathrm{Exp}\left[-0.55 \frac{q_0}{k_B T}\right] \mathrm{cm}^{-3} \quad (14)$$

Concentration $N_B$ is determined from sub-threshold slope n value found for the transistor type of differential pair using parameter S=103 mV/dec for the slope change caused by one decade of drain current change determined at particular temperature which is expressed by:

$$n(T_0) = \frac{S(T_0)}{\ln[10]\varphi_{T_0}} \quad (15)$$

Using the measurement condition Vdd=Vs in expression (13) and n(T$_0$) derived from expression (15), the well doping concentration $N_B$ is derived as $N_B$=2.941×10$^{17}$ cm$^{-3}$. Temperature dependence of the threshold current now may be calculated from expression (11) with the necessary parameters available.

In the circuit implementation, substituting expression (13) into expression for the threshold shut off current (expression (8)) with available parameters and Vdd-Vw=1.3 V as determined by the circuit 100, the shut off current temperature dependence is calculated. The result of these calculations for the asymmetry number m=28 and Rp(T$_0$)=2.7 Ohm determined by an application for the circuit 100 is shown in FIG. 2.

The calculated result shows 98.6 ppm/° C. temperature coefficient dependence of the shut off threshold current. However, Vs has more elaborate temperature dependence and may be considered constant only in the first approximation.

Figure 3:
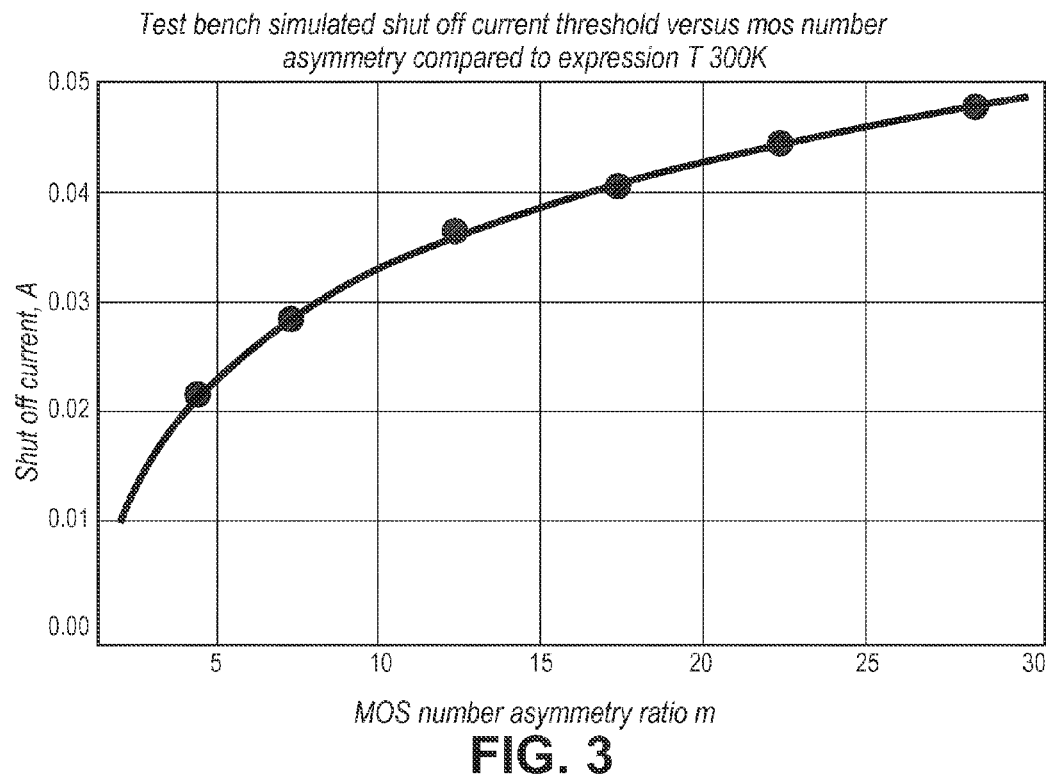
FIG. 3 is a diagrammatic illustration depicting calculated threshold current versus asymmetrical devices utilized within an asymmetric differential circuit.

The threshold shut off current may be set to a certain specified value by utilizing a different m number of transistors 106. FIG. 3 illustrates a calculated threshold current versus asymmetry number m using expression (8) and (13) with parameters above determined. FIG. 3 also illustrates a circuit simulated threshold shut-off current value dependence with respect to the asymmetric differential circuit 102 index m in a design compared to the threshold shut-off current calculated analytically (simulations are conducted utilizing T=300K).

Figure 2:
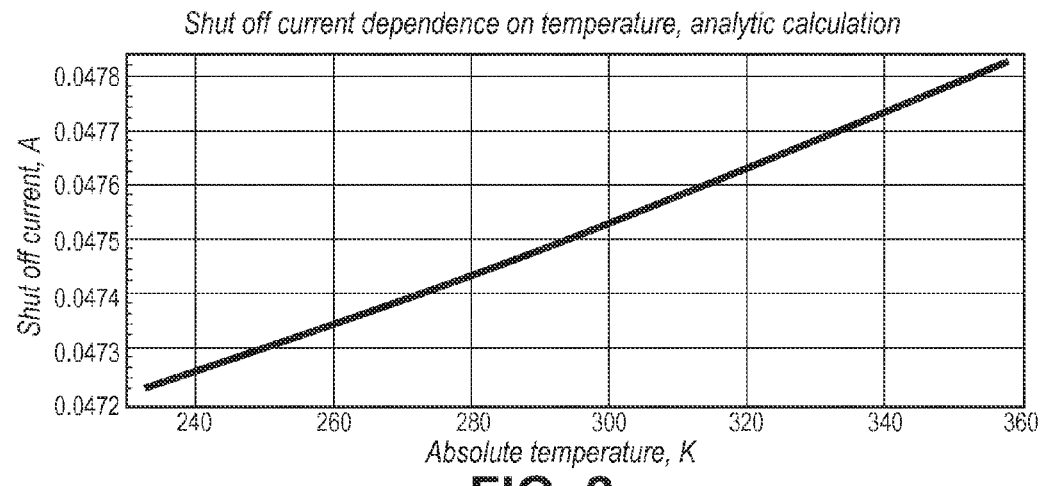
FIG. 2 is a diagrammatic illustration depicting a calculated shut off current temperature dependence.
Figure 4:
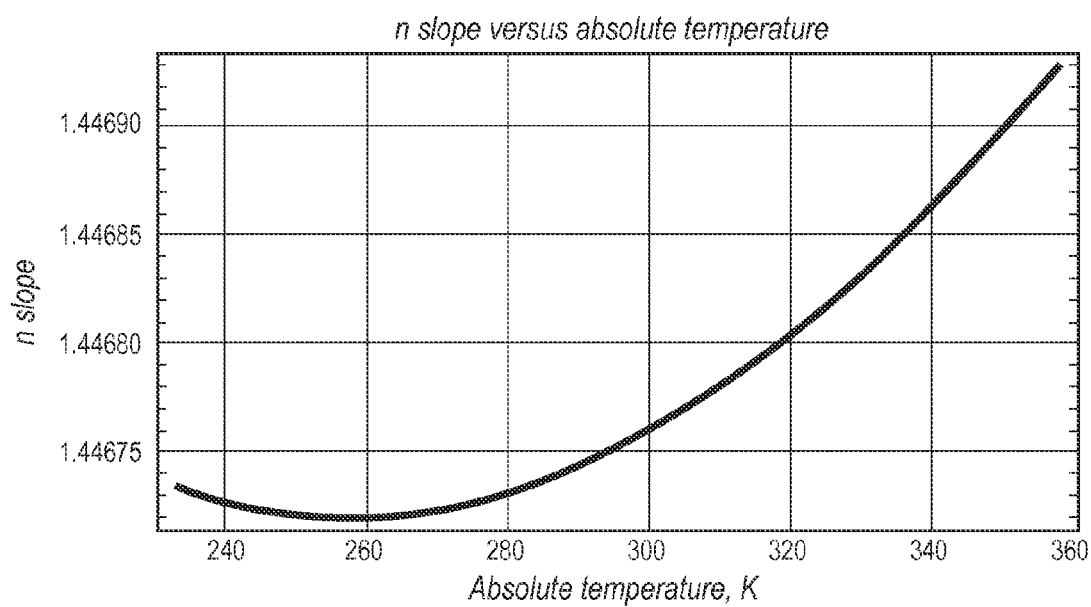
FIG. 4 is a diagrammatic illustration depicting temperature dependence of sub-threshold coefficient.

The asymmetric differential circuit 102 source voltage Vs temperature dependence making n(T) less dependent on temperature, while in graph of FIG. 2, voltage Vs is assumed constant. Applying expression (1) for a transistor 104 of the differential pair for the flip flop module 134 transition condition the following expression for the source to well potential difference is obtained:

$$V_W - V_S = -\varphi_T \ln\left[\frac{I_0/2}{2n_0\mu_p C_{ox}\frac{W}{L}\varphi_T^2}\right] + \frac{V_L(I_{th}) + V_{SW0} - |V_{tp0}| + (|\alpha_{Vt0}| + |\alpha_{SW0}|)(T-T_0)}{n_0} \quad (16)$$

where $I_0$—the differential pair current source value of FIG. 1, $V_L(I_{th})$—voltage over load 116 at shut off conditions, $V_{SW0}$ voltage over switch at nominal temperature, $V_{tp0}$—the transistor threshold voltage at nominal temperature, $\alpha_{VT0}$=−1.5 mV/° C.—temperature coefficient of the threshold voltage, $\alpha_{SW0}$=0.25 mV/° C.—temperature coefficient of voltage drop on switch at $I_{th}$ current through the load 116, $n_0$—sub-threshold slope coefficient found from expression (13) at nominal temperature. Substituting expression (16) into expression (13), a more accurate temperature dependence of sub-threshold slope is obtained, which is presented in the FIG. 4.

An expression for the threshold current that includes voltage dependence of the sense resistor may be expressed as follows:

$$I_{th} = \frac{n(T)\varphi_T \ln[m]}{R_p(T)(1 + \alpha_V(n(T)\varphi_T \ln[m])^2)} \quad (17)$$

where voltage dependence of the resistance is described by $\alpha_V$ coefficient, which may be modeled as $\alpha_V$=6.23*10^-3 1/V^2.

Figure 5:
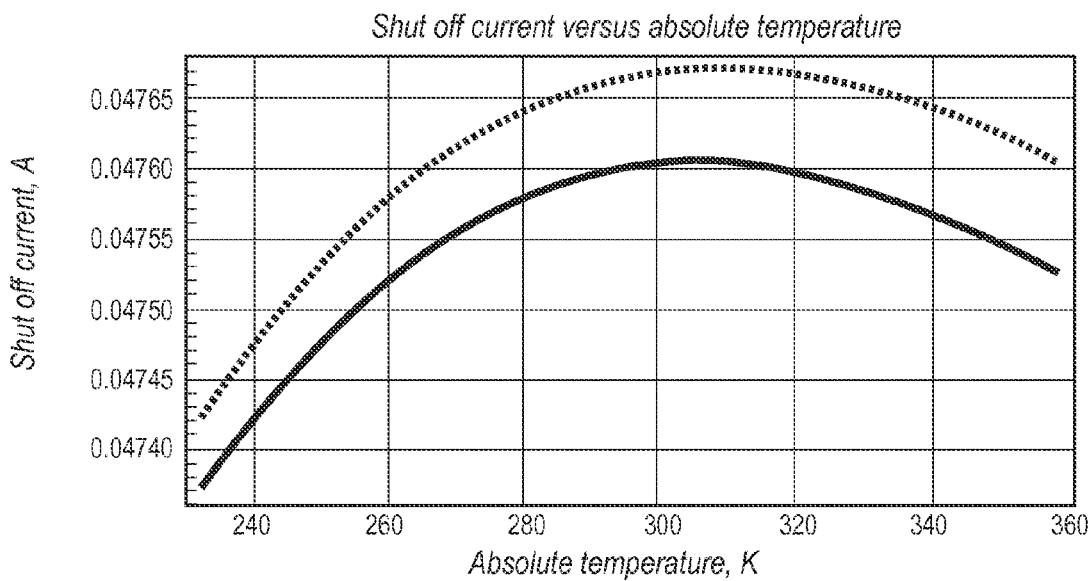
FIG. 5 is a diagrammatic illustration depicting calculated shut off current temperature dependencies based upon a differential pair biasing currents of 250 nA and 500 nA.

Substituting temperature dependent functions for n(T) and Rp(T) in expression (17) using expressions (13), (16), and (10) the shut off currents temperature dependencies are calculated for the differential pair biasing currents of 250 nA and 500 nA. The result of above calculation is illustrated in FIG. 5. This result illustrates that the temperature dependence of band-gap reference level is reached with a weak dependence of the shut off threshold current on the circuit biasing current $I_0$ (e.g., current source 111), which may be beneficial in various applications.

Figure 6:
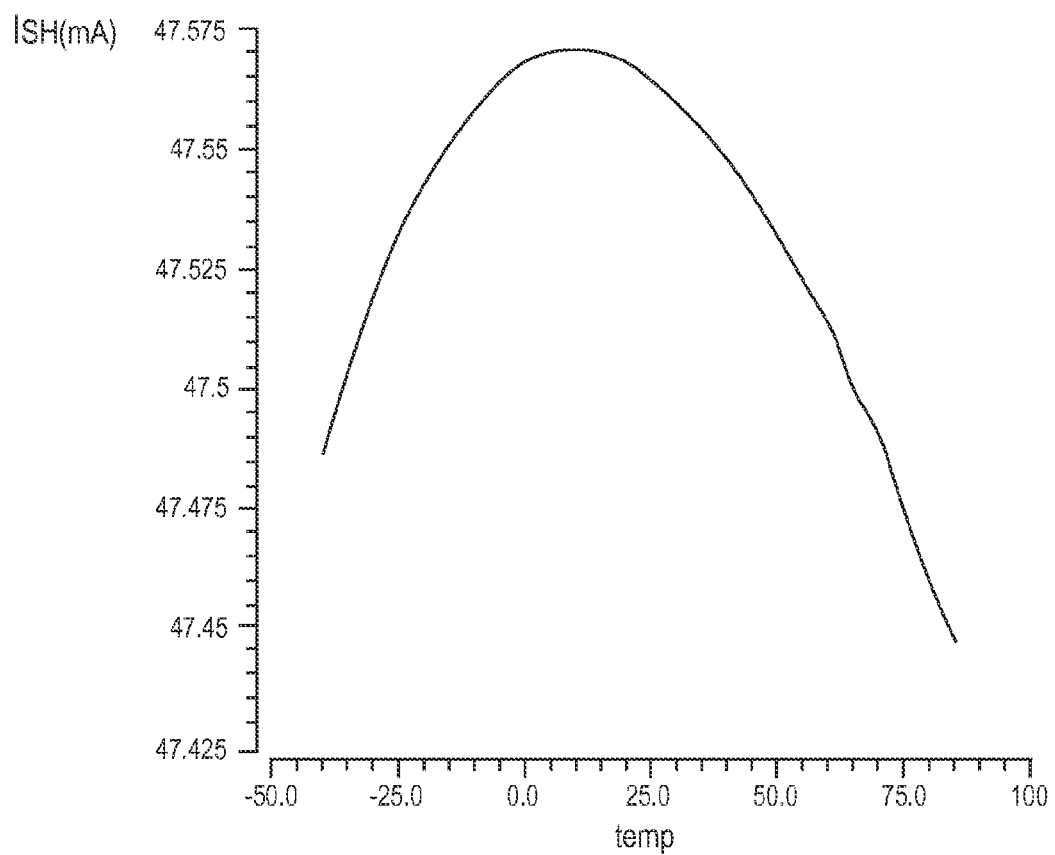
FIG. 6 is a diagrammatic illustration depicting simulated temperature stability of the threshold shut off current.
Figure 7:
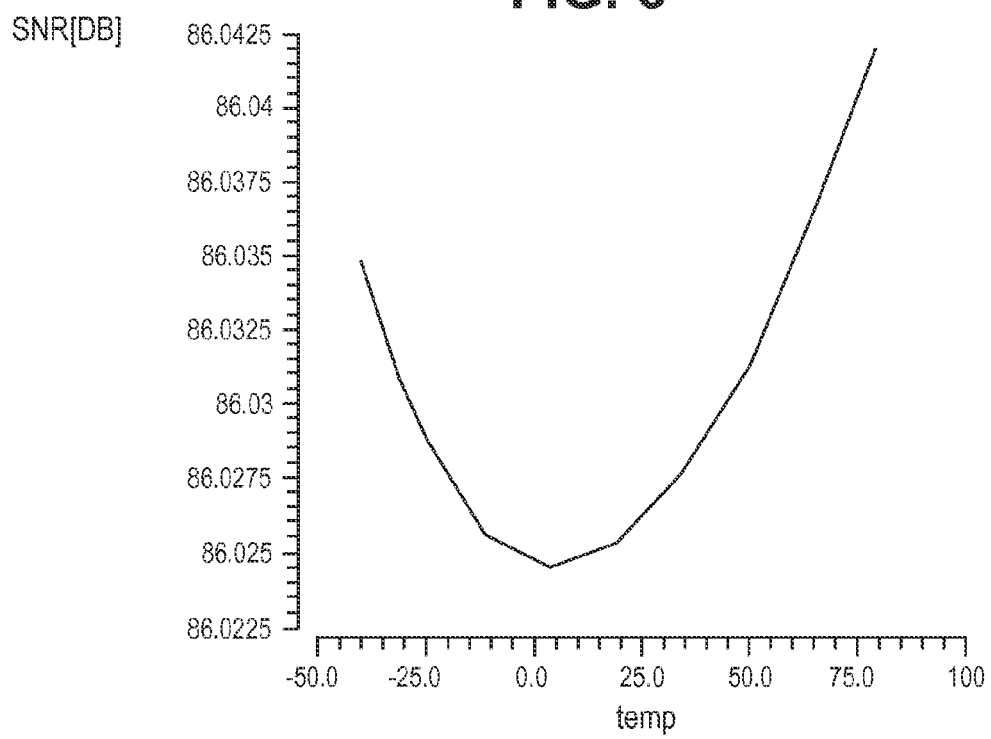
FIG. 7 is a diagrammatic illustration depicting noise performance results depicting signal-to-noise (SNR) temperature at the inputs for the signal producing the flip-flop module transitioning conditions.
Figure 8:
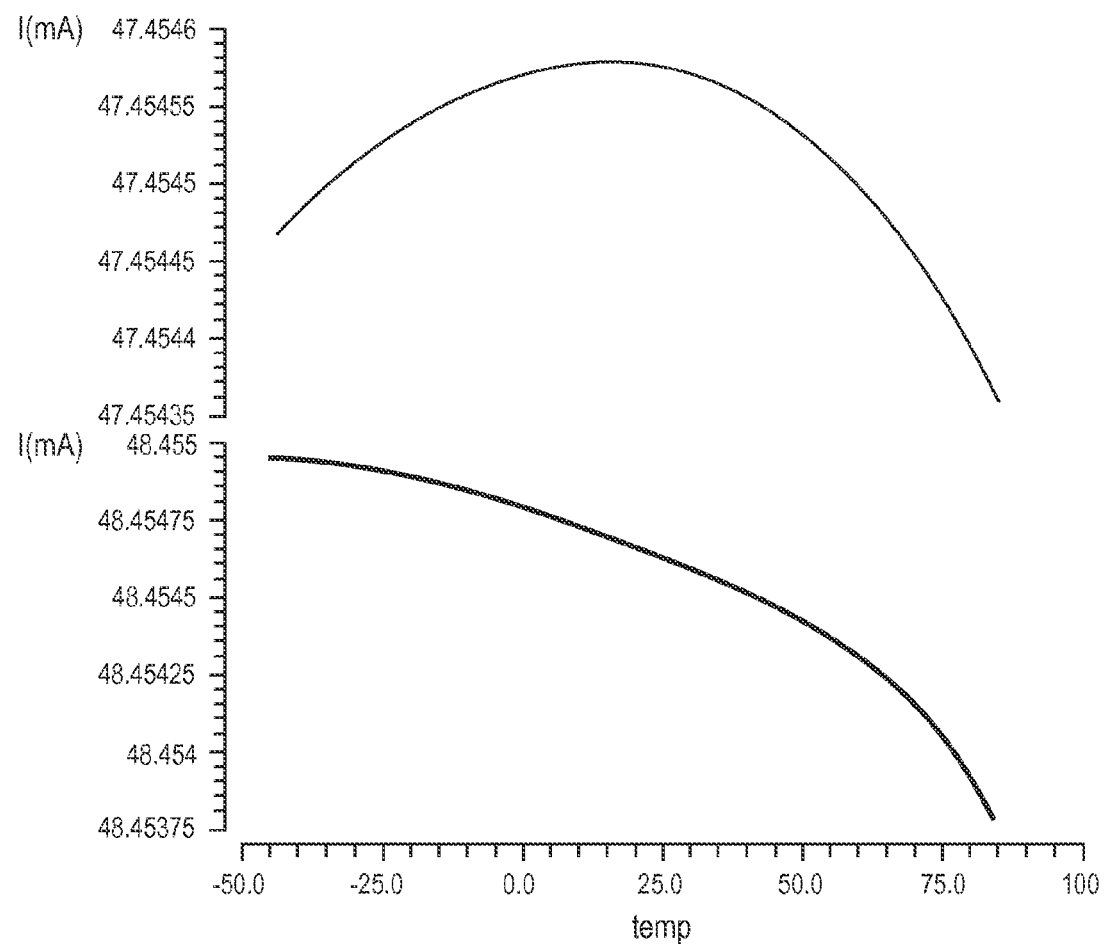
FIG. 8 is a diagrammatic illustration depicting a simulated comparison of temperature scan for the threshold current at with biasing current of differential pair at 250 nA (top) and 500 nA (bottom).

FIG. 6 illustrates a graph representing the temperature stability of the threshold shut off current to which second order terms in the temperature coefficient of resistivity and salicide resistor voltage dependence produces a beneficial impact. FIG. 7 illustrates a graph of noise performance results depicting signal-to-noise (SNR) temperature dependence at the inputs for the signal producing the flip-flop module 134 transitioning conditions. It is understood that the temperature stability of the threshold current does not require accurate biasing of the circuit 100. FIG. 8 illustrates a comparison of temperature scan for the threshold current at with biasing current of differential pair at 250 nA (top) and 500 nA (bottom). When biasing current increases, the temperature stability of the threshold current remains largely the same, while the average threshold current may be increased by about 2%.

As discussed above, the circuit includes one or more transistors circuit operating in weak inversion in combination with one or more current sensing elements (e.g., polysalicide resistors) to allow obtaining a temperature stable threshold current sensing. For example, the circuit 100 utilizes an asymmetric number of transistors arranged in a differential circuit that senses a voltage drop over the current sensing element produced by the sensed current. The circuit does not require band-gap or other type of temperature stable references or accurate control of the circuit biasing while reaching temperature coefficient for the sensed threshold current at the level typical of the band gap references.

Figure 9:
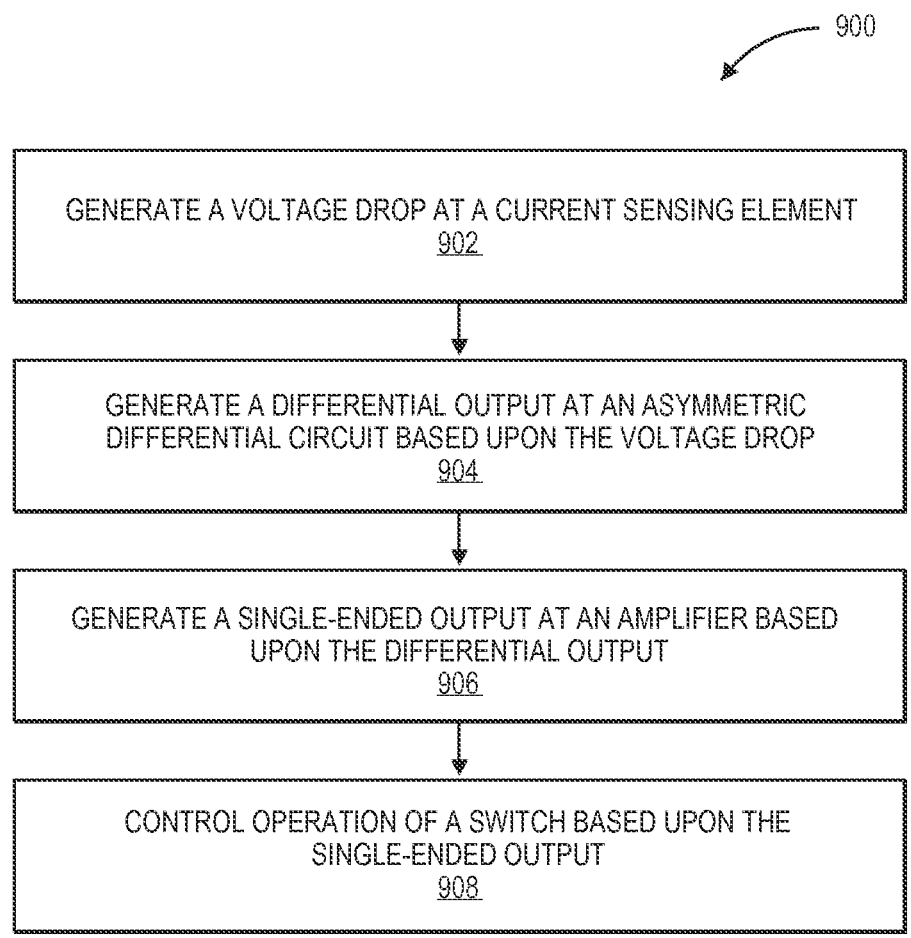
FIG. 9 illustrates an example method for controlling operation of the shut-off circuitry, such as the shut-off circuitry shown in FIG. 1, in accordance with an example implementation of the present disclosure.

FIG. 9 illustrates an example method 900 for controlling operation of a shut off circuit, such as shut off circuit 100, in accordance with an example implementation of the present disclosure. As shown in FIG. 9, a voltage drop is generated at a current sensing element based upon a current generated by a current source and a load electrically connected to the current sensing element (Block 902). For example, a voltage drop occurs at the current sensing element 118 based upon current generated by the current source 120. A differential output is generated at an asymmetric differential circuit based upon the voltage drop (Block 904). In an implementation, the asymmetric differential circuit 102 generates a differential output based upon the voltage drop at the current sensing element 118.

As shown in FIG. 9, a single-ended output is generated at an amplifier based upon the differential output (Block 906). For instance, the amplifier 126 generates a single-ended output based upon the differential output provided by the asymmetric differential circuit 102. Operation of a switch is controlled by the single-ended output (Block 908). For example, as discussed above, a flip-flop module 134 transitions between a first state and a second state based upon the single-ended output and provides a control signal to the switch 136 to control operation of the switch (e.g., whether the switch 136 allows current flow or prevents current flow).

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:
1. A circuit comprising:
  a current sensing element configured to generate a voltage drop based upon a current generated by a drive current source through a load electrically connected to the current sensing element;
  an asymmetric differential circuit configured to generate a differential output based upon the voltage drop;
  an amplifier electrically coupled to the asymmetric differential circuit, the amplifier configured to generate a single-ended output based upon the differential output; and
  a flip-flop module electrically connected to the amplifier, the flip-flop module configured to transition between a first state and a second state based upon the single-ended output, wherein the flip-flop module is configured to control operation of a switch, the switch configured to control current flow to the load, wherein the asymmetric differential circuit comprises a first transistor and a plurality of second transistors, the first transistor connected to a first node comprising an electrical interconnection between a first port of the current sensing element and the drive current source, the plurality of second transistors connected to a second node comprising an electrical interconnection between a second port of the current sensing element and the plurality of second transistors.

2. The circuit as recited in claim 1, wherein current sensing element comprises at least one of a poly-salicide or metal resistor.

3. The circuit as recited in claim 1, further comprising a current source electrically connected to the first transistor and the plurality of second transistors, the current source configured to generate a current such that the first transistor and the plurality of second transistors operate in weak inversion.

4. The circuit as recited in claim 1, wherein the first transistor and the plurality of second transistors comprise p-type metal-oxide-semiconductor field-effect transistor devices.

5. The circuit as recited in claim 1, wherein the first transistor and the plurality of second transistors comprise n-type metal-oxide-semiconductor field-effect transistor devices.

6. The circuit as recited in claim 1, wherein the amplifier comprises an operational amplifier.

7. The circuit as recited in claim 1, wherein the current source and the load are electrically connected in series to the current sensing element.

8. A circuit comprising:
   a current sensing element having a first port and a second port, the current sensing element configured to generate a voltage drop based upon a current generated by drive current source through a load electrically connected to the current sensing element;
   asymmetric differential circuit including a first input, a second input, a first output, and a second output, the asymmetric differential circuit comprising a first transistor and a plurality of second transistors, the first transistor comprising the first input electrically connected to the first port and the plurality of second transistors comprising the second input electrically connected to the second port, the asymmetric differential circuit configured to generate a differential output based upon the voltage drop;
   an amplifier electrically coupled to the first output and the second output, the amplifier configured to generate a single-ended output based upon the differential output; and
   a flip-flop module electrically connected to the amplifier, the flip-flop module configured to transition between a first state and a second state based upon the single-ended output,
   wherein the flip-flop module is configured to control operation of a switch, the switch configured to control current flow to the load.

9. The circuit as recited in claim 8, wherein current sensing element comprises at least one of a poly-salicide or a metal resistor.

10. The circuit as recited in claim 8, further comprising a current source electrically connected to the first transistor and the plurality of second transistors, the current source configured to generate a current such that the first transistor and the plurality of second transistors operate in weak inversion.

11. The circuit as recited in claim 8, wherein the first transistor and the plurality of second transistors comprise p-type metal-oxide-semiconductor field-effect transistor devices.

12. The circuit as recited in claim 8, wherein the first transistor and the plurality of second transistors comprise n-type metal-oxide-semiconductor field-effect transistor devices.

13. The circuit as recited in claim 8, wherein the amplifier comprises an operational amplifier.

14. The circuit as recited in claim 8, wherein the current source and the load are electrically connected in series to the current sensing element.

15. A method comprising:
   generating a voltage drop at a current sensing element based upon a current generated by a drive current source through a load electrically connected to the current sensing element;
   generating a differential output at an asymmetric differential circuit based upon the voltage drop, the asymmetric differential circuit electrically connected to the current sensing element;
   generating a single-ended output at an amplifier based upon the differential output, the amplifier electrically connected to the asymmetric differential circuit; and
   controlling operation of a switch based upon the single-ended output,
   wherein a flip-flop module is configured to transition between a first state and a second state based upon the single-ended output and provide a control signal to the switch based upon at least one of the first state or the second state, wherein the asymmetric differential circuit comprises a first transistor and a plurality of second transistors, the first transistor connected to a first node comprising an electrical interconnection between a first port of the current sensing element and the drive current source, the plurality of second transistors connected to a second node comprising an electrical interconnection between a second port of the current sensing element and the plurality of second transistors.

16. The method as recited in claim 15, wherein current sensing element comprises at least one of a poly-salicide or a metal resistor.

17. The method as recited in claim 15, wherein the load comprises a forward biased vertical-cavity surface-emitting laser device.

18. The method as recited in claim 15, wherein the current source and the load are electrically connected in series to the current sensing element.

* * * * *